United States Patent [19]

Masuda et al.

[11] 4,107,757
[45] Aug. 15, 1978

[54] PULSE POWER SOURCE

[75] Inventors: Senichi Masuda, 40-10-605, 1-chome, Nishigahara, Kita-ku, Tokyo-to, Japan; Junji Hirai, Nagoya, Japan

[73] Assignee: Senichi Masuda, Japan

[21] Appl. No.: 811,786

[22] Filed: Jun. 30, 1977

[51] Int. Cl.² .............................................. B05B 5/00
[52] U.S. Cl. ...................................... 361/235; 320/1; 323/25; 55/105
[58] Field of Search ....................... 361/227, 230, 235; 320/1; 55/105; 323/22 SC, 24, 25, 17; 307/265, 268, 269; 328/59, 60

[56] References Cited

U.S. PATENT DOCUMENTS

| 3,872,370 | 3/1975 | Regnault | 361/235 |
| 3,895,211 | 7/1975 | Pentegov et al. | 320/1 |
| 3,958,131 | 5/1976 | Mozdzer | 323/25 |

*Primary Examiner*—Gerald Goldberg
*Attorney, Agent, or Firm*—Price, Heneveld, Huizenga & Cooper

[57] ABSTRACT

In a pulse power source for applying a pulse voltage to a capacitive load; a series resonance circuit capable of generating transient oscillation is formed of the capacitive load adapted to be applied with the pulse voltage, an inductance for generating transient oscillation and a power source capacitor; the capacitive load is charged from the power source capacitor by first closing one of two switch elements provided in the midway of the resonance circuit, that is, a load charging switch element to make the voltage across said capacitive load rise up to about twice the voltage across the power source capacitor after a period equal to about ½ of a transient oscillation period of said series resonance circuit, to form a rising edge of the desired pulse voltage; then reversely, the power source capacitor is charged from the capacitive load by closing the other switch element, that is, a charge recovering switch element after first said one switch element has been closed to make the voltage across said capacitive load fall down, to form a falling edge of the desired pulse voltage; and further a residual charge on said capacitive load is discharged by closing still another switch element provided in parallel to said capacitive load, to improve the falling edge of the desired pulse voltage; whereby a steep pulse voltage can be applied to said capacitive load with a low power loss.

12 Claims, 12 Drawing Figures

PULSE POWER SOURCE

The present invention relates to a pulse power source which is enabled to apply a steep pulse voltage to a load consisting of an electrostatic capacity or an electrostatic capacity having a high resistance connected in parallel thereto (hereinafter referred to as "capacitive load") with a low power loss.

When a pulse voltage is applied to a capacitive load by means of a pulse power source in the prior art, it has been required (1) that the output impedance of the power supply should be very low and the power supply should have a capability of supplying a heavy current momentarily because an extremely large charging current is necessitated for making the rising edge of the pulse voltage steep, and (2) that in order to make the falling edge of the pulse voltage steep a sufficiently low discharge resistance should be connected in parallel to said capacitive load so as to quickly discharge an electric charge $C_0V_0$ (Coulombs) charged on an electrostatic capacity $C_0$ (Farads) of said capacitive load by a pulse voltage $V_0$ (Volts). However, such prior art pulse power sources had great difficulties that the condition (1) above required an excessive momentary output capacity for the pulse power source and made the cost of the pulse power source excessively high, and that the condition (2) above made a heavy current to flow through said low resistance upon every application of the pulse voltage, resulting in an excessive Joule's heat loss. Furthermore in view of the necessity of thermally dissipating the energy $\frac{1}{2}C_0V_0^2$ (Joules) stored in said electrostatic capacity $C_0$ after disappearance of the applied pulse voltage, the power loss had to become excessively large with respect to the pulse power that is actually dissipated in the load itself.

It is one object of the present invention to provide a pulse power source which is free from the above-described disadvantages and which is enabled to apply an extremely steep pulse voltage to every type of capacitive loads with a low power loss.

According to one feature of the present invention, there is provided a pulse power source for applying a pulse voltage to a capacitive load, comprising a D.C. power source, a power source capacitor having a sufficiently large electrostatic capacity with respect to an electrostatic capacity of said capacitive load and connected across said D.C. power source via a current limiting impedance, a parallel connection of a load charging switch element and a load charge recovering switch element which can be individually opened or closed, said parallel connection of switch elements and an inductance for generating transient oscillation being serially connected between one end of said power source capacitor and one end of said capacitive load, the other end of said power source capacitor being connected to the other end of said capacitive load, a parallel connection of a rectifier element for preventing inverse charging of said capacitive load and a switch element for discharging residual charge on said capacitive load, which are connected in parallel to said capacitive load, and control means for successiveling making said load charging switch element, charge recovering switch element and residual charge discharging switch element conduct in the above-described sequence for a period substantially equal to a pulse width of said pulse voltage, a period substantially equal to one-half period of said transient oscillation and a pulse pause interval, respectively.

Above-mentioned and other features and objects of this invention will become more apparent by reference to the following description taken in conjunction with the accompanying drawings, in which.

Before entering a detailed description of the respective embodiments of the present invention, essential features of the present invention which are common to all the illustrated embodiments will be described generally with reference to the entire drawings.

According to the present invention, the above-described object is achieved through the following steps of operation:

a. a power source capacitor having a sufficiently large electrostatic capacity $C_1$ with respect to an electrostatic capacity $C_0$ of the capacitive load is preliminarily charged up to a voltage $V_1$ that is equal to about $\frac{1}{2}$ of a peak value $V_0$ of the desired pulse by means of a D.C. power source;

b. this power source capacitor is connected by an appropriate switch element $S_0$ (for instance, silicon controlled rectifier element, bi-directional 3-terminal thyristor (TRIAC), switching discharge tube, rotary switch, etc.) to said capacitive load via an appropriate inductance L and a lead wire having an extremely small resistance to thereby generate transient oscillation having very little attenuation, resulting in charging of the capacity $C_0$ of said capacitive load up to about twice the voltage $V_1$, that is, up to $V_0$, and immediately thereafter the conduction through said switch element $S_0$ is interrupted;

c. nextly, after a period $\tau$ (seconds) corresponding to the desired pulse width has elapsed, said capacitive load which has been charged up to a value near to $V_0$ is again connected to said power source capacitor $C_1$ which has been charged up to a voltage of $V_1 \doteqdot \frac{1}{2} V_0$, through said series inductance L and the low resistance lead wire by means of another switch element $S_1$ connected in parallel to said switch element $S_0$, owing to transient oscillation generated thereby and likewise having very little attenuation most of the charge stored in the electrostatic capacity $C_0$ of the capacitive load is recovered into said power source capacitor $C_1$ and simultaneously the voltage across the electrostatic capacity $C_0$ of the capacitive load is reduced to a very small value (bringing this value to zero is impossible from the reasons as described later), and immediately thereafter the conduction through said switch element $S_1$ is interrupted; and d. subsequently, the opposite ends of said capacitive load are short-circuited through another switch element $S_2$, so that the residual charge is discharged returning the voltage across said capacitive load to its initial value of 0, and immediately thereafter the conduction through said switch element $S_2$ is interrupted.

It is to be noted that in the last step d) of the above operation, if the voltage across the capacitive load is not returned to its initial value of 0, then the residual voltage will successively approach to $V_1$ and the peak value of the pulse voltage appearing across the capacitive load will be shifted from $2V_1$ to $V_1$ as the operation cycles are repeated, and as will be described later, eventually the generation of a pulse voltage according to the present invention will become impossible. In addition, since an inductance l is always involved in the discharging circuit including said capacitive load and the switch element $S_2$ (especially when a silicon controlled rectifier element is used, the current change rate di/dt is large, and so, a protective inductance is inserted in order to suppress this current change rate), if no provision is made, the electrostatic capacity $C_0$ of the capacitive load will be charged in an opposite polarity. Therefore, in order to prevent such opposite polarity charging, it is necessary to connect a rectifier element $G_0$ (flywheel rectifier element) having the direction of rectification for preventing discharging of the electric charge on the electrostatic capacity $C_0$ of the capacitive load given by the power source, in parallel to said capacitive load, for attenuating the charging current in the opposite direction while circulating through the rectifier element $G_0$.

More particularly, the novel pulse power source according to the present invention is characterized in that said pulse power source comprises a power source capacitor 1 having sufficiently large electrostatic capacity $C_1$ with respect to an electrostatic capacity $C_0$ of a capacitive load, a D.C. power source connected between the opposite ends $A_0$ and $A_1$ of said power source capacitor 1 via an appropriate charging impedance (resistance or inductance) in order to charge this capacitor 1 up to a voltage $V_1$, an appropriate load charging switch element $S_0$ connected to one end $A_0$ of said power source capacitor for opening and closing the connection between said power source capacitor and the capacitive load, an output terminal $B_0$ connected to the other end of said switch element $S_0$ for applying a pulse voltage to the capacitive load, a transient oscillation generating inductance L connected in series in the path between said terminals $A_0$ and $B_0$, the other output terminal $B_1$ connected to the other end $A_1$ of said power source capacitor, another appropriate switch element $S_1$ for recovering electric charge on the load capacitance that is connected between said terminals $A_0$ and $B_0$ in parallel to said switch element $S_0$, another switch element $S_2$ for discharging residual charge on the load capacitance that is connected between said output terminals $B_0$ and $B_1$ for opening and closing the connection therebetween, a rectifier element $G_0$ for preventing inverse charging of the load capacitance that is connected between said output terminals $B_0$ and $B_1$ in parallel to said switch element $S_2$ with such direction of rectification that it may oppose against the charging voltage on said power source capacitor, and a control section 9 adapted to successively close said switch elements $S_0$, $S_1$ and $S_2$ in the order of $S_0 \rightarrow S_1 \rightarrow S_2 \rightarrow S_0 \rightarrow S_1 \rightarrow S_2 \rightarrow S_0 \rightarrow S_1 \rightarrow S_2 \rightarrow S_0 \rightarrow \ldots$ for a period equal to a pulse width $\tau$ of the desired pulse voltage, a minute period $\theta_1$ somewhat larger than one-half period $\theta_0$ of oscillation of the series resonance circuit 1-L-19, and a period equal to a pulse pause interval $T_1$, respectively.

Owing to the aforementioned circuit arrangement, said switch elements $S_0$, $S_1$ and $S_2$ are successively closed and opened, in such manner that at first by closing said switch $S_0$ the power source capacitor 1 which has been preliminarily charged up to the voltage $V_1$ is connected to the capacitive load including the load capacitance $C_0$ to generate transient oscillation having very little attennuation. After the load capacitance $C_0$ has been charged by the transient oscillation up to the voltage $V_0$ that is nearly twice the voltage $V_1$ the switch $S_0$ is opened. Subsequently after a period equal to the desired pulse width $\tau$, to said power source capacitor 1 is again connected the load that has been charged up to a higher voltage than said capacitor 1 by closing said switch element $S_1$. After most of the electric charge stored in the load capacitance $C_0$ has been recovered into the power source capacitor 1 by the transient oscillation having very little attenuation that is thereupon generated the switch $S_1$ is opened. Then by closing said switch element $S_2$ immediately after the opening of the switch $S_1$ the charge remaining in the load capacitance $C_0$ without being recovered out is discharged. After the residual voltage on the load capacitance $C_0$ has been returned to 0 by attenuating the electric energy in the form of a circulating current through the loop circuit of $B_0 \rightarrow S_2 \rightarrow B_1 \rightarrow G_0 \rightarrow B_0$ the switch $S_2$ is opened, and thereby, while applying a steep pulse voltage to the capacitive load, most of the electric energy stored in the load capacitor 19 can be again recovered into the power source capacitor 1.

Consequently, the novel pulse power source according to the present invention can achieve remarkable functions and advantages which could not be realized at all by the pulse power sources in the prior art, in that a steep pulse voltage having a very short rising time corresponding to one-half period $\theta_0$ of the aforementioned transient oscillation can be applied to a capacitive load, and in that energy charged on a load capacitance can be effectively recovered into a power source to greatly reduce a power loss and thereby a high efficiency of the order of about 80% can be maintained.

For the switch elements $S_0$, $S_1$ and $S_2$ used in the pulse power source according to the present invention, silicon controlled rectifier elements, bi-directional 3-terminal thyristors (TRIAC), switching discharge tubes, rotary switches, power transistors, or any other switch elements could be employed. Employment of silicon controlled rectifier elements is favorable, and in this case there is an additional advantage that opening operations of said switch elements $S_0$, $S_1$ and $S_2$ can be automatically achieved at the time point when the conducting current is reduced to 0. It is to be noted that the above-described switch element $S_0$ used according to the present invention can also achieve the function of the switch element $S_1$ connected in parallel thereto by employing appropriate types of elements such as bi-directional 3-terminal thyristors (TRIAC), rotary switches, or by employing them in combination with appropriate circuit elements (for example, rectifier elements in a bridge connection) as shown in the alternative embodiments described later, and thereby the switch element $S_1$ can be omitted.

In addition, though the residual electric charge still remaining on the load capacitor 19 after the electric charge thereon has been recovered on the power source capacitor 1 may be directly discharged by short-circuiting the terminals $B_0$ and $B_1$ by closing the switch element $S_2$ as described above, this residual charge could be further recovered on the power source capacitor 1 through the following process. That is, a charge recovering transformer 24 (FIGS. 6, 7 and 8) is employed in such manner that its primary winding 25 is connected between the output terminals $B_0$ and $B_1$ via said switch element $S_2$, and its secondary winding 27 having a turn ratio for sufficient step-up with respect to the primary winding 25 is connected between the terminals $A_0$ and $A_1$ of said power source capacitor 1 via a discharge preventing rectifier element $G_3$ (the direction of rectification is the direction for preventing discharge of the voltage on said power source capacitor 1).

Figure 6:
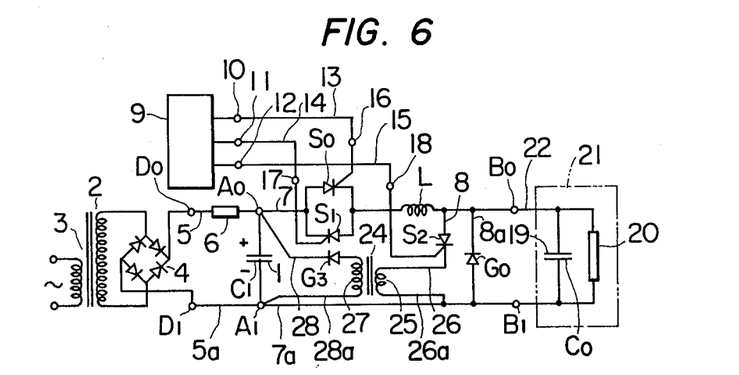
Figure 7:
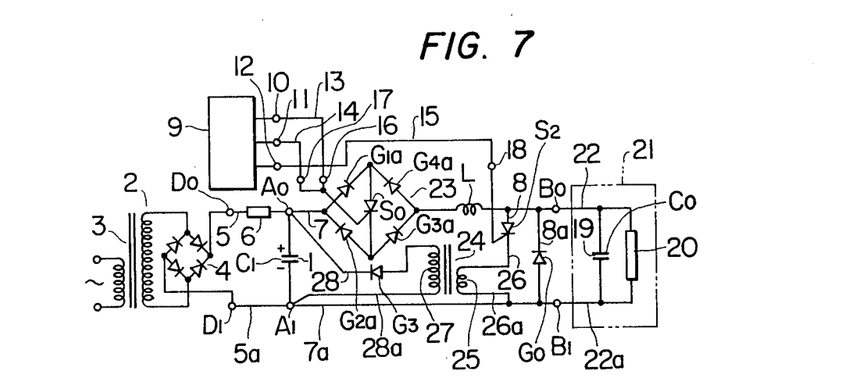
Figure 8:
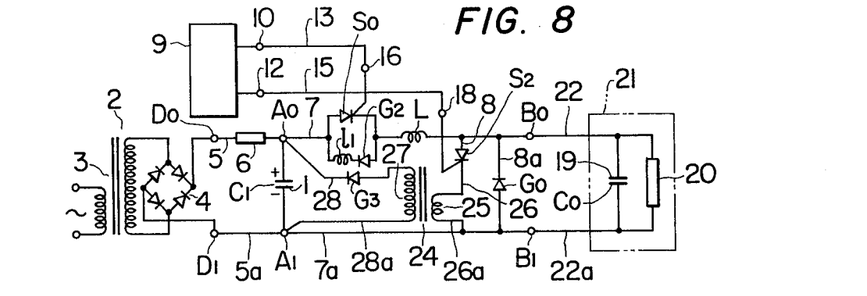

Accordingly, when said switch element $S_2$ is closed, owing to the residual voltage on the load capacitance 19 a discharge current will flow through the primary winding 25 of said charge recovering transformer 24. Then in response thereto a secondary current flows through said secondary winding 27 and flows into said power source capacitor 1, and most of said residual charge will be further recovered on the power source capacitor 1. By making such provision, the power loss can be further reduced and the efficiency can be enhanced to as high as 90% or more. It is a matter of course that for the charge recovering capacitor, besides the conventional transformers a single winding transformer and a pulse transformer could be employed.

In addition, when the repetetion period $T_0 = \tau + \theta_1 + T_1$ of the desired pulse voltage to be applied according to the present invention is sufficiently long with respect to a time constant of the capacitive load, it is possible to insert an appropriate inductance in place of said switch element $S_2$ so as to discharge the residual charge on the load capacitance through said inductance, or to omit said switch element $S_2$ and said rectifier $G_0$ so as to discharge the residual charge on the load capacitance through the load resistance.

The novel pulse power source according to the present invention can be used generally for the purpose of applying a steep pulse voltage to various capacitive loads having a large electrostatic capacity. However, especially it is suitable to be employed for applying a steep and periodic high-tension pulse voltage supperposed with a D.C. voltage between discharge electrodes and dust-collecting electrodes. Electric dust collecting apparatus may employ a steep and periodic pulse voltage either directly or superposed with a bias voltage between discharge electrodes and third electrodes which has associated discharge electrodes, dust-collecting electrodes and third electrodes, in which a D.C. voltage for establishing a main electric field is applied between the third electrodes and the dust-collecting electrodes. A pulse voltage is also applied between the discharge electrodes and the third electrodes (for instance, see U.S. Pat. No. 3,980,455, issued Sept. 14, 1976). A steep and periodic pulse voltage may also be superposed with a D.C. high voltage between a discharge electrode and a drive electrode of an electrostatic power painting apparatus of such type that said apparatus comprises a discharge electrode and a drive electrode. A D.C. high voltage is applied to the drive electrode to establish a main electric field between the drive electrode and a grounded body to be painted, and a pulse voltage is applied between said drive electrode and said discharge electrode (for instance, U.S. Patent No. 4,011,991, issued Mar. 15, 1977). It is to be noted that in these examples of application, the pulse voltage is superposed with a D.C. voltage, it is desirable to connect an appropriate filter circuit including a capacitor for by-passing the pulse voltage, in parallel to a power source of said D.C. voltage.

Figure 1:
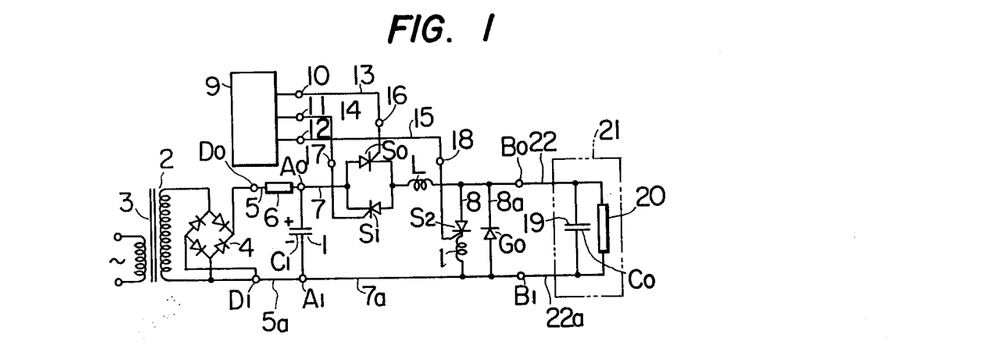
FIG. 1 is a circuit diagram showing one preferred embodiment of the present invention.

The detailed arrangement and features of the novel pulse power source according to the present invention will be described in connection to its preferred embodiments. Referring first to FIG. 1 of the drawings, a circuit diagram of the novel pulse power source according to the present invention is shown. In this figure, reference numeral 1 designates a power source capacitor having an electrostatic capacity $C_1$ (Farads), numeral 2 designates a D.C. power source for charging the power source capacitor 1, said D.C. power source consisting of a transformer 3 and rectifiers 4 (in the illustrated example, consisting of four rectifier elements connected in a bridge form) connected across a secondary winding of the transformer 3, and one of the output terminals $D_0$ of the rectifiers 4 (having a positive polarity in the illustrated example) is connected to one end $A_0$ of said power source capacitor 1 via a lead wire 5 and a current-limiting impedance (inductance or resistance) 6. In addition, the other output terminal $D_1$ of the rectifiers 4 is connected to the other end $A_1$ of the power source capacitor 1 via a lead wire 5a. The terminal $A_0$ is connected to an output terminal $B_0$ of this pulse power source through a low resistance lead wire 7, a silicon controlled rectifier element $S_0$ serving as a load charging switch element and an inductance L for generating transient oscillation, while the other terminal $A_1$ is connected to the other output terminal $B_1$ of this pulse power source via a low resistance conductor 7a. Reference character $S_1$ designates a silicon controlled rectifier element serving as another switch element connected in parallel to the switch element $S_0$ for recovering electric charge on the load capacitance 19, reference character $S_2$ designates a silicon controlled rectifier element serving as still another switch element for discharging residual charge on the load capacitance 19, that is connected between the output terminals $B_0$ and $B_1$ through a protective inductance $l$ and a low resistance lead wire 8, and reference character $G_0$ designates a rectifier element for preventing inverse charging of the load capacitance 19, that is connected in parallel to the series circuit of the switch element $S_2$ and the inductance $l$ via a low resistance lead wire 8a. It is to be noted that the directions of rectification of the above-referred silicon controlled rectifier elements $S_0$, $S_1$ and $S_2$ are the directions of $A_0 \rightarrow B_0$, $B_0 \rightarrow A_0$ and $B_0 \rightarrow B_1$, respectively, as represented in terms of the terminals in the illustrated embodiment, and the direction of rectification of the rectifier element $G_0$ is the direction of $B_1 \rightarrow B_0$ in the illustrated embodiment. Reference numeral 9 designates a control section for the silicon controlled rectifier elements $S_0$, $S_1$ and $S_2$, and output terminals 10, 11 and 12 of the control section 9 are connected to gate terminals 16, 17 and 18, respectively, of the switch elements $S_0$, $S_1$ and $S_2$ viz conductors 13, 14 and 15 to apply control pulse voltages to these gate terminals. Between the output terminals $B_0$ and $B_1$ is connected via low resistance lead wires 22 and 22a a capacitive load 21 that is represented by a parallel connection of a load capacitor 19 having an electrostatic capacity $C_0$ (Farads) and a resistor 20 having an extremely large resistance R (Ohms).

Representing now a desired output peak voltage of this pulse power source by $V_0$ (Volts), a desired pulse width by $\tau$ (Seconds) and a desired pulse pause interval by $T_1$ (Seconds), then as noted previously, the repetition period $T_0$ takes the value of $T = \tau + \theta_1 + T_1$ (Seconds). Under such a condition, if transient oscillation having very little attenuation is generated upon closure of the switch element $S_0$ by selecting the D.C. output voltage of the D.C. power source 2 and thus the terminal voltage across the power source capacitor 1 approximately equal to $V_1 = \frac{1}{2}V_0$, selecting the circuit resistance including lead wires sufficiently small and appropriately selecting the value of the inductance L, then the load capacitor 19 can be charged up to approximately $V_0 = 2V_1$ as will be described later. It is to be noted that the electrostatic capacity $C_1$ of the power source capacitor 1 is selected sufficiently large with respect to the electrostatic capacity $C_0$ of the load ($C_1 > C_0$).

In order to realize the aforementioned operation, the value of the inductance L for generating transient oscillation must be determined taking into consideration the following three conditions (I) to (III):

I. When a circuit resistance r (Ohms) of the loop circuit consisting of 1-$A_0$-7-$S_0$-L-$B_0$-22-19-22a-$B_1$-7a-$A_1$-1 is selected, not only it is necessary to select such condition that upon closure of the switch element $S_0$, oscillation may be generated in the loop circuit, but also it is necessary that the load capacitor 19 may be charged up to as close as twice the voltage $V_1$ by the transient oscillation, and upon closure of the switch element $S_1$ the residual charge on the capacitor 19 may be recovered into the power source capacitor 1 as much as possible by the transient oscillation. For such purpose, as will be explained later, it is necessary to fulfill the condition $L/C \gg r^2$ so as to suppress voltage attenuation during one-half period of the oscillation as much as possible.

II. As a second requirement for the inductance L, it is required to achieve the function of maintaining the currents through the silicon controlled rectifier elements $S_0$ and $S_1$ and their time derivative $di/dt$ less than tolerable values. Accordingly, with regard to the value of the inductance L, it is necessary to select a sufficiently large value for the inductance L.

III. On the other hand, it is necessary to reduce the rising time and falling time $\theta_0 = \pi\sqrt{LC_0}$ (Seconds) of the pulse voltage by selecting the value of L as small as possible within the limit for the sufficiently large value as required by the condition (II) above.

With regard to the value of the protective inductance $l$, it is necessary to select the inductance $l$ at a sufficiently large value for maintaining the current through the silicon controlled rectifier element $S_2$ and its time derivative $di/dt$ less than tolerable values, but it is desirable to reduce the time constant of current attenuation upon discharge of the residual electric charge by selecting the inductance $l$ as small as possible within the first-mentioned limit.

The control section 9 at first feeds a control pulse voltage from its output terminal 10 to the gate terminal 16 of the silicon controlled rectifier element $S_0$, than after a period $\tau$ (Seconds) corresponding to a desired pulse width feeds a control pulse voltage from its output terminal 11 to the gate terminal 17 of the silicon controlled rectifier element $S_1$, immediately thereafter (more exactly, after a period $\theta_1$ that is somewhat larger than the above-referred period $\theta_0$ (Seconds)) feeds a control pulse voltage from its output terminal 12 to the gate terminal 18 of the silicon controlled rectifier element $S_2$, subsequently after a pulse pause interval $T_1$ (Seconds) again feeds a control pulse voltage from its output terminal 10 to the gate terminal 16 of the silicon controlled rectifier element $S_0$, and then the above-described operations are repeated.

As a result, in the circuit according to the present invention, application of a periodic pulse voltage to a load and recovery of electric charge to a power source are effected through the following operations. That is, at the moment when the control pulse voltage has been applied to the gate terminal 16 of the silicon controlled rectifier element $S_0$, the element $S_0$ is turned ON, and thereby a charging current flows from the terminal $A_0$ to the power source capacitor 1 through the lead wires 7 and 7a, transient oscillation generating inductance L, output terminals $B_0$ and $B_1$, and low resistance lead wires 22 and 22a to the load capacitor 19 of the capacitive load 21. The variations of the resulted charging current $i$ (Amperes) and the terminal voltage $v$ (Volts) across the load capacitor 19 is a function of elapse time $\tau$ (Seconds) from the turn-ON point take the form of damped oscillation, provided that the above-referred circuit resistance r is sufficiently small, the value of the inductance L is appropriate and the condition for oscillation of $1/L(1/C_0 + 1/C_1) > (r/2L)^2$ is fulfilled, and they are represented by the following equations:

$$v = V_0(1 - e^{-\frac{t}{\tau_0}} \cos \omega_0 t), \quad (1)$$

$$i = i_0 e^{-\frac{t}{\tau_0}} \{\cos(\omega_0 t - \phi) - \cos\phi\}, \quad (2)$$

$$\text{where } V_0 = \frac{V_1}{1 + \frac{C_0}{C_1}}, \tau_0 = \frac{2L}{r}, \quad (3)$$

$$\omega_0 = \sqrt{\frac{1}{L}\left(\frac{1}{C_0} + \frac{1}{C_1}\right) - \left(\frac{r}{2L}\right)^2}, i_0 = $$

$$V_1 \sqrt{\frac{C_0 C_1}{L(C_0 + C_1)}},$$

$$\phi = \tan^{-1}\omega_0\tau_0 = $$

$$\tan^{-1}\sqrt{\frac{4L}{r^2}\left(\frac{1}{C_0} + \frac{1}{C_1}\right) - 1}$$

Figure 2:
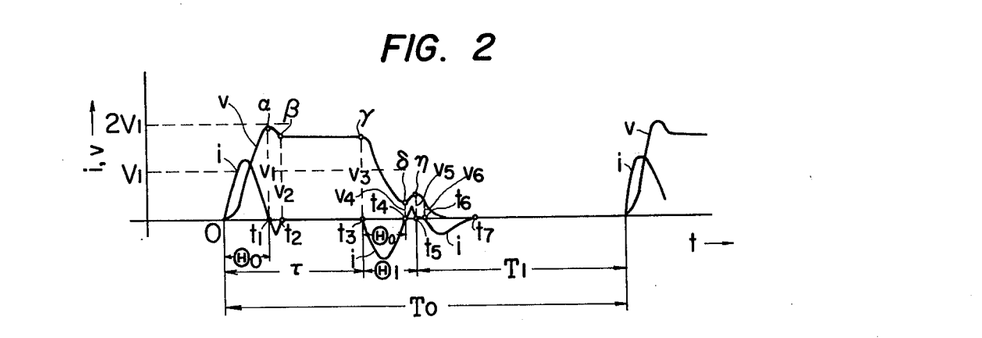
FIG. 2 is a waveform diagram showing waveforms of an output pulse current and an output pulse voltage of the circuit illustrated in FIG. 1, FIGS. 3 and 4 are circuit diagrams of alternative preferred embodiments of the present invention.

The waveforms of $v$ and $i$ are illustrated in FIG. 2, in which both $v$ and $i$ rises as time elapses starting from $t = 0$, and at the time point of $t = t_1 = 2\phi/\omega_0$ the current takes the value $i = 0$, resulting in application of a voltage in the direction of $B_0 \rightarrow A_0$ across the silicon controlled rectifier element $S_0$, so that this element is turned OFF. At this moment, the value $v_1$ of the terminal voltage across the load capacitor 19 is represented by the following equation:

$$v_1 = V_0(1 - e^{-t_1/\tau_0} \cos 2\phi) \quad (4)$$

1. Here, in order to increase the value of the pulse voltage $v_1$ as large as possible, as will be obvious from Equations (3), it is necessary to select the capacitances so as to fulfill $C_1 \gg C_0$, and in this case $V_0 \doteq V_1$ can be obtained.

2. In order to quicken the rise of the pulse voltage, it is necessary to increase $\omega_0$ as large as possible, and as will be obvious from Equations (3), for this purpose it is necessary to fulfill the condition $(1-L/C_0) \gg (r/2L)^2$, that is, $L/C \gg r^2$, in other words it is necessary to select the value of $r$ small. In this case, $\omega_0 \doteqdot \sqrt{LC}$ can be established.

3. In this case, as will be likewise obvious from the Equations (3), we obtain the relation of $\phi \doteqdot \tan^{-1} \sqrt{4L/C_0/r^2} \doteqdot \pi/2$. Then, the time point when the current is reduced to 0 is $t_1 = \pi/\omega_0$, which is approximately equal to one-half period of transient oscillation $\theta_0 \doteqdot \pi\sqrt{LC_0}$.

4. The pulse voltage value $v_1$ at this moment becomes $v_1 = V_1(1 + e^{-\theta/\tau_0})$ according to Equation (4) and the condition 1. above. Accordingly, in order to increase the value $v_1$ as large as possible, it is necessary to fulfill the condition $$\theta/\tau_0 = \pi\sqrt{LC_0}/2L/r \ll 1, \text{ that is, } L/C_0 \gg r^2 \qquad (20)$$

so as to suppress the attenuation after one-half period of the oscillation, in other words, to select a sufficiently large value of $\tau_0 = 2L/r$ with respect to the given $C_0$. Thereby $v_1 \doteqdot V_1$ can be realized.

5. In order to fulfil the condition of $di/dt$ required for the silicon controlled rectifier element $S_0$, it is necessary to select the value of L so that $t_1 = \theta_0 = \pi\sqrt{LC_0}$ may exceed a predetermined value.

6. In addition, in order to suppress the current value required for the silicon controlled rectifier element $S_0$ to a desired value, as will be apparent from $i_0$ in Equations (3) above, it is necessary to select the value of L at least larger than a given value.

At the moment when the current becomes $i = 0$, since a voltage of about $2V_1 - V_1 = V_1$ is applied to the series connection of the silicon controlled rectifier element $S_0$ and the inductance L in the inverse direction (the direction of $B_0 \rightarrow A_0$) as described above, in practice an inverse current will flow through the capacitor even after the time point $t_1$, until the time point $t_2$ as shown in FIG. 2. In correspondence thereto, the voltage $v$ will pass over the peak value $\alpha$ corresponding to $v_1 \doteqdot 2V_1$ and will be held only after it has reached the value $\beta$ corresponding to the value $V_2$ that is somewhat smaller than $2V_1$, and thereafter the voltage is attenuated extremely slowly owing to the large time constant $C_0R$ of the capacitive load.

Nextly at the time point $t_3$ (then, the switch element $S_0$ has been, of course, turned OFF), a control pulse voltage is applied to the gate terminal 17 of the silicon controlled rectifier element $S_1$. At this moment, the element $S_1$ is turned ON, and now an oscillatory current $i$ flows from the load capacitor 19 which takes the voltage $v_3$ at the time point $\gamma$ that is somewhat smaller than $2V_1$ (of course $v_3 < v_2$) towards the power source capacitor 1 which takes the voltage $V_1$ through the transient oscillation generating inductance L as shown in FIG. 2, and consequently, a substantial part of the electric charge stored in the load capacitor 19 ($C_0$) can be recovered on the power source capacitor 1 ($C_1$). The waveform of voltage during this process is as shown in FIG. 2. Representing the elapse of time after the time point $t_3$ by $t$, the change with time of the voltage $v$ and the current $i$ during this time period is represented by the following equations:

$$v \doteqdot V_1 + (v_3 - V_1)\cos \omega_0 t \qquad (5)$$

$$i = -i_{01}\sin \omega_0 t \qquad (6)$$

where $i_{01} = (v_3 - V_1)\sqrt{C_0/L}, \qquad (7)$ and the other parameters are the same as those defined by Equations (3). More particularly, at the time point $t_4$ when one-half period of transient oscillation $\theta_0 = \pi\sqrt{LC_0}$ has elapsed from the time point $t_3$, the current $i$ is reduced to 0, the switch element $S_1$ is turned OFF and the voltage $v$ reaches the $\delta$ point corresponding to the minimum value $v_4 = 2V_1 - v_3$. In practice, as has been described already, owing to the fact that an inverse current flows through the capacitance of the silicon controlled rectifier element $S_1$ after it has been turned OFF, the voltage $v$ rises again from $v_4$, the inverse current ceases at the time point $t_5$ and the voltage $v$ is held at the $\eta$ point corresponding to $v_5$ ($v_5 > v_4$), so that the corresponding electric charge remains on the load capacitor 19. Subsequently, immediately thereafter (at the time point $t_6$) (then, of course, the switch element $S_1$ has been turned OFF) the silicon controlled rectifier element $S_2$ is turned ON in response to application of a control pulse voltage to the gate terminal 18 of the element $S_2$, so that the electric charge $C_0v_5$ remaining on the load capacitor 19 is discharged through the element $S_2$ and the protective inductance $l$, and the voltage $v$ and current $i$ are reduced to 0 through the process of variation with time as illustrated in FIG. 2. During this process, at the moment when the voltage $v$ has been reduced to 0 (at the time point $t_6$), the current $i$ takes the maximum value of negative polarity, but at the same moment the current $i$ shifts to the rectifier $G_0$ for preventing inverse charging to form a circulation current, so that charging of the load capacitor 19 in the inverse polarity can be prevented, the current attenuates with time due to Joule's loss caused by the resistance of the circulating path, and eventually becomes 0 at the time point $t_7$. It has been experimentally confirmed that through the above-described process about 80% of the energy fed to the load capacitor 19 can be recovered again in the power source.

Figure 3:
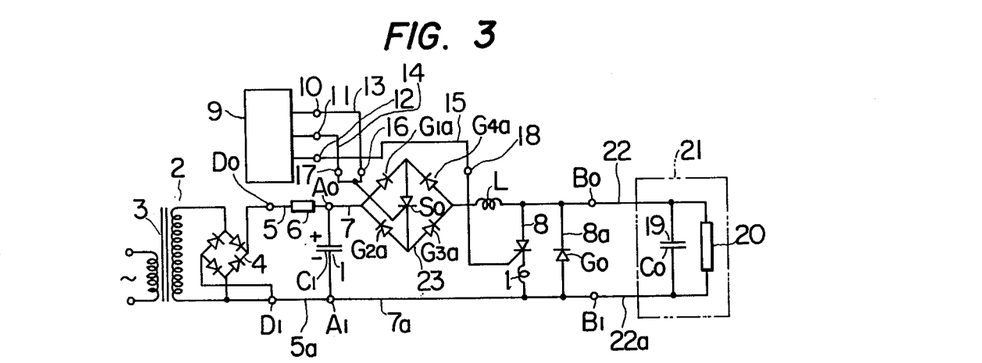

FIG. 3 shows an alternative embodiment of the present invention, in which in place of the parallel connection of the switch elements $S_0$ and $S_1$ in the first embodiment shown in FIG. 1, a bridge type rectifier circuit 23 consisting of four rectifiers $G_{1a}$, $G_{2a}$, $G_{3a}$ and $G_{4a}$ connected in a bridge form and having a silicon controlled rectifier element $S_0$ added along its one diagonal, is substituted to make the switch element $S_0$ also function as the switch element $S_1$. Therefore, in this modified embodiment, the switch element $S_1$ is omitted, and the terminal 17 which was used for applying a control pulse voltage from the output terminal 11 of the control section 9 to the gate of the switch element $S_1$ in the first embodiment shown in FIG. 1, is connected in common to the terminal 16 leading to the gate of the switch element $S_0$. It is to be noted that the direction of rectification of one pair of rectifiers $G_{1a}$ and $G_{3a}$ in opposed arms is the direction of $A_0 \rightarrow B_0$, while that of the other pair of rectifiers $G_{2a}$ and $G_{4a}$ in opposed arms is the direction of $B_0 \rightarrow A_0$. The names and functions of the elements represented by numerals 1 to 22a and characters are exactly the same as those of the elements represented by like numerals and like characters in FIG. 1.

When a control pulse voltage is fed from the output terminal 10 of the control section 9 to the gate terminal 16 of the silicon controlled rectifier element $S_0$ in FIG.

3, the silicon controlled rectifier element $S_0$ is turned ON, so that an oscillatory charging current $i$ flows from the power source capacitor 1 along the path consisting of $1 \rightarrow 7 \rightarrow G_{1a} \rightarrow S_0 \rightarrow G_{3a} \rightarrow L \rightarrow B_0 \rightarrow 22 \rightarrow 19 \rightarrow 22a \rightarrow 7a \rightarrow 1$, and therefore, the voltage $v$ across the load capacitor 19 is raised by charging up to a voltage near to about twice the voltage $V_1$ on the power source capacitor 1, and the element $S_0$ is turned OFF. The variations with time of the current $i$ and voltage $v$ during this process are not different from that in the case of FIG. 1, and they are represented by the curves during the period of $0 \rightarrow t_1 \rightarrow t_2$ in FIG. 2. Subsequently, after a period $\tau$ (Seconds) when a control pulse voltage is fed from the output terminal 11 of the control section 9 to the gate terminal 17 of the same silicon controlled rectifier element $S_0$, the element $S_0$ is again turned ON. However, at this moment, since the terminal voltage across the load capacitor 19 is near to $2V_1$ and is higher than the terminal voltage $V_1$ across the power source capacitor 1, an oscillatory discharge current $i$ flows from the former towards the latter along the path consisting of $19 \rightarrow 22 \rightarrow B_0 \rightarrow L \rightarrow G_{4a} \rightarrow S_0 \rightarrow G_{2a} \rightarrow 7 \rightarrow A_0 \rightarrow 1 \rightarrow 7a \rightarrow B_1 \rightarrow 22a \rightarrow 19$, and therefore, the voltage $v$ across the load capacitor is reduced to a value near to 0, and the element $S_0$ is again turned OFF. The variations with time of the current $i$ and the voltage $v$ during this process are also not different from that in the case of FIG. 1, and they are represented by the curves during the period of $t_3 \rightarrow t_4 \rightarrow t_5$ in FIG. 2. Likewise, all the operations and the variations with time of the current $i$ and the voltage $v$ during subsequent period of $t_5 \rightarrow t_6 \rightarrow t_7$ are exactly the same as those in the case of FIG. 1, taking the same mode as represented in FIG. 2, and therefore, further explanation will be omitted.

Figure 4:
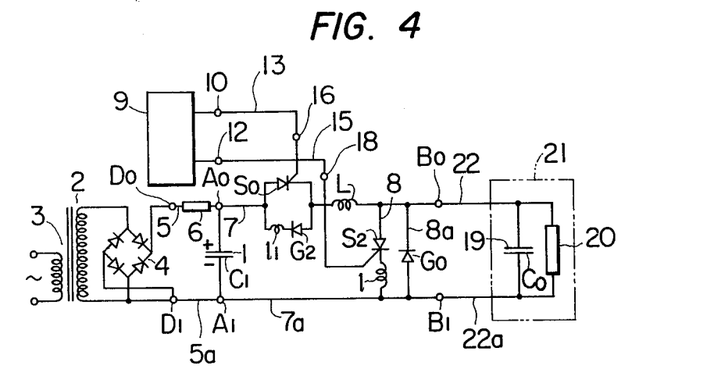
Figure 5:
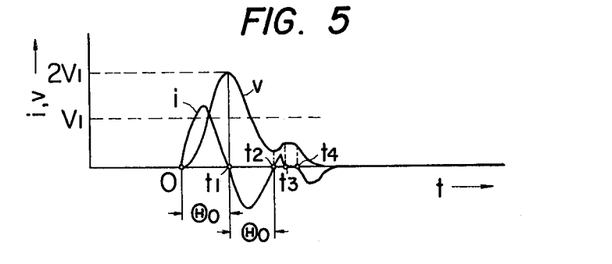
FIG. 5 is a waveform diagram showing waveforms of an output pulse current and an output pulse voltage of the circuit illustrated in FIG. 4, FIGS. 6, 7 and 8 are circuit diagrams of modifications of the embodiments illustrated in FIGS. 1, 3 and 4, respectively.

FIG. 4 is a circuit diagram of a modified embodiment in which a rectifier $G_2$ is employed in place of the silicon controlled rectifier element $S_1$ in the first embodiment shown in FIG. 4. In this figure, reference character $l_1$ designates an inductance interposed in series with the rectifier $G_2$ and in parallel to the switch element $S_0$, and this inductance $l_1$ serves to assure turning-OFF of the switch element $S_0$. The names and functions of the other elements represented by numerals 1 to 22a and characters in FIG. 4 are exactly the same as those of the elements represented by like numerals and like characters in FIG. 1. In addition, the variations of the voltage $v$ and $i$ until the time point $t_1$ in FIG. 2 which follow the turning-ON of the silicon controlled rectifier element $S_0$, are also the same as those in the case of FIG. 1. However, in this particular embodiment, although the current $i$ becomes 0 at the time point $t_1$, thereafter an inverse voltage of $V_1$ in the direction of $B_0 \rightarrow A_0$ is applied to the rectifier $G_2$, and an inverse current begins to flow through the rectifier $G_2$, unless the inductance $l_1$ is provided, an inverse voltage necessary for turning-OFF would not be applied to the switch element $S_0$ because the rectifier $G_2$ is connected in parallel to the switch element $S_0$, and all the inverse voltage of $V_1$ is applied across the inductance L. By inserting the inductance $l_1$ the inverse voltage necessary for turning-OFF can be applied to the switch element $S_0$ for a necessary period of time, and thereby the switch element $S_0$ can be surely turned OFF. Owing to this discharge current flowing through the rectifier $G_2$, recovery of the electric charge from the load capacitor 19 to the power source capacitor 1 begins at once, and the subsequent variations of the current $i$ and the voltage $v$ are as shown in FIG. 5, in which at the time point $t_2$ that is further one-half period of oscillation after the time point $t_1$ the current $i$ returns to O and the voltage $v$ takes the minimum value near to 0. Thereafter, since a current flows further in the positive direction for a short period through the capacitance of the rectifier $G_2$, the voltage $v$ somewhat rises, the current $i$ becomes O at the time point $t_3$, and the voltage $v$ is held at the value at this time point $t_3$. The subsequent operations for discharging the residual charge on the load capacitor 19 by means of the switch element $S_2$, are similar to those in the case of FIG. 1, and the variations with time of the current $i$ and voltage $v$ during this period are exactly the same as the variations of the current $i$ and voltage $v$ after the time point $t_6$ in FIG. 2. The pulse voltage obtained by this modified system takes a pulsating waveform having a half width of about $\theta_0$ and a peak value of $2V_1$, and does not take the waveform of rectangular pulses having a predetermined pulse width $\tau$. However, the economical advantage that the switch element $S_1$ can be substituted by a rectifier $G_2$, is remarkable, and there exist not few applications which can well achieve their objects with such a waveform.

FIG. 6 is a circuit diagram of another modified embodiment of the present invention, in which the higher order recovery of energy by means of recovering transformer as described previously is incorporated in the first embodiment of the invention shown in FIG. 1. More particularly, in series with the silicon controlled rectifier element $S_2$ serving as a switch element for discharging residual electric charge on the load capacitor 19, is connected one end of a primary winding 25 of the previously described recovering transformer 24 via a low resistance lead wire 26, the other end of the primary winding 25 being connected to the output terminal $B_1$ via a low resistance lead wire 26a, while one end of a secondary winding 27 (the number of turns has a sufficiently high step-up ratio with respect to the number of turns of the primary winding 25) of the recovering transformer 24 is connected to one end $A_0$ of the power source capacitor 1 via a discharge preventing rectifier $G_3$ and a low resistance lead wire 28 (it is assumed that the direction of rectification of the rectifier $G_3$ is the direction adapted to prevent the power source capacitor 1 from discharging), and the other end of the secondary winding 27 is connected to the other end $A_1$ of the power source capacitor 1 via a low resistance lead wire 28a. Thereby, at the time point $t_5$ shown in FIG. 2 when the switch element $S_2$ is turned ON, the residual electric charge $C_0v_5$ on the load capacitor 19 can be discharged through the primary winding 25, so that in the secondary winding 27 is generated an induced electromotive force that is sufficiently higher than the voltage $V_1$, and by making the secondary current flow into the power source capacitor 1 through the path consisting of $27 \rightarrow G_3 \rightarrow 28 \rightarrow 1 \rightarrow 28a \rightarrow 27$, most of the residual energy $\frac{1}{2}C_0v_5^2$ on the load capacitor 19 can be recovered on the power source capacitor 1. It has been verified that an electric power efficiency can be enhanced to 90% or higher by the above-described provision. In this modified embodiment, since the inductance of the primary winding 25 can be used in place of the protective inductance $l$ in FIG. 1, the inductance $l$ is omitted. In addition, the names and functions of the elements represented by numerals 1 ~ 22a and the elements represented by characters in FIG. 6 are exactly the same as those of the elements represented by like numerals and like characters in FIG. 1, and therefore, all the operations other than the above-described energy recovery process are not different from the operations in the embodiment shown in FIG. 1.

FIGS. 7 and 8 show modified embodiments in which the above-described recovering transformer 24 is incorporated in the embodiments shown in FIGS. 3 and 4, respectively, and since the method for use and the operation are exactly the same as those of the embodiment shown in FIG. 6 and they are self-explanatory from the illustrations, further explanation thereon will be omitted.

In the above described embodiments illustrated in FIGS. 1 through 8, although the silicon controlled rectifier elements $S_0$, $S_1$ and $S_2$ serving as switch elements as well as the rectifiers $G_0$, $G_{1a} \sim G_{4a}$, $G_2$ and $G_3$ are all illustrated as one element, it is a matter of course that as the desired pulse voltage becomes higher, each of these elements can be formed of a necessary number of elements connected in series, and it will be self-explanatory that in such a case an appropriate known voltage-divider circuit may be added for the purpose of improving voltage share among the respective elements and firing of the respective elements $S_0 \sim S_2$ can be easily effected by making use of known methods. In addition, if necessary, it is possible to increase a pulse output current by connecting a number of elements in parallel to each other.

Figure 9:
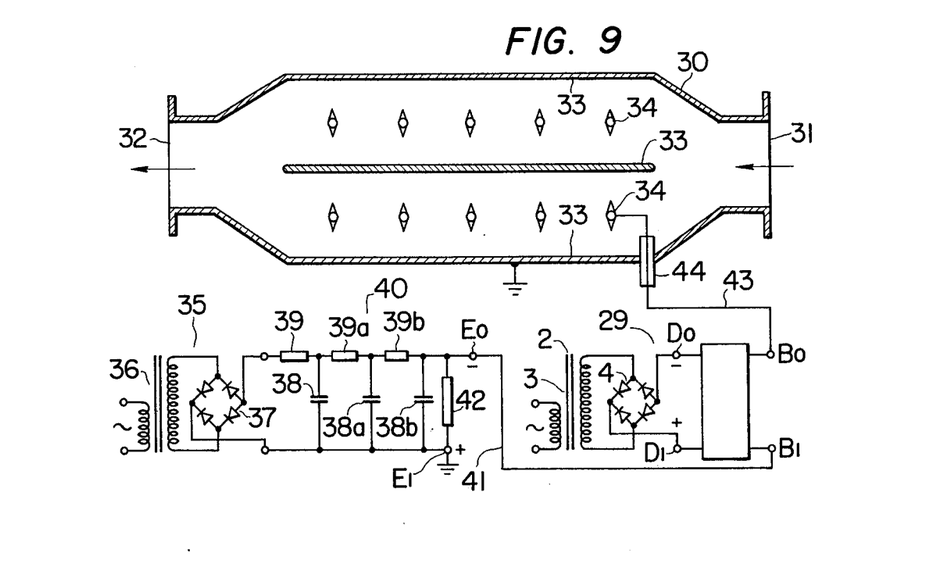
FIGS. 9, 10 and 11 shows applications of the pulse power source according to the present invention to electric dust collecting apparatuses of different types.

FIG. 9 shows one example of application of the pulse power source according to the present invention, in which the novel pulse power source according to the present invention is connected in series with a known D.C. high voltage power source, and these power sources are utilized for applying a steep negative pulse voltage superposed with a negative D.C. high voltage to discharge electrodes of a known electric dust collecting apparatus which consists of discharge electrodes and dust collecting electrodes. In this figure, the electric dust collecting apparatus incorporates between the discharge electrodes and the dust collecting electrodes an electrostatic capacitance and a high parallel resistance corresponding to a corona discharge, and so, this apparatus provides a typical capacitive load. Reference numeral 29 designates a pulse power source according to the present invention including those illustrated in FIGS. 1, 3, 4, 6, 7 and 8. However, in the illustrated example of application, the pulse power source is adapted to feed a pulse voltage of negative polarity, and accordingly, the forward directions of the silicon controlled rectifier elements $S_0$, $S_1$ and $S_2$ and the rectifiers 4, $G_0$, $G_{1a}$, $G_{2a}$, $G_{3a}$, $G_{4a}$, $G_2$ and $G_3$ are all reversed. Reference numeral 30 designates a main body of an electric dust collecting apparatus, numeral 31 designates an inlet of a dust-containing gas, numeral 32 designates an outlet of a clean gas, numeral 33 designates a dust-collecting plate that is grounded jointly with the main body 30, and numeral 34 designates a group of discharge electrodes insulatively supported for effecting a corona discharge. Reference numeral 35 designates a negative D.C. high voltage power source provided with a step-up transformer 36 and a rectifier 37, and a positive polarity terminal of its output terminals is grounded. The output terminals are connected to a filter circuit 40 for bypassing a pulse voltage, which consists of T-type connections of capacitors 38, 38a, 38b, ... and impedances (resistances or inductances) 39, 39a, 39b, ..., and a negative polarity output terminal $E_0$ of the circuit 40 is connected via a low resistance lead wire 41 to the positive polarity output terminal $B_1$ of the negative pulse power source 29, to feed a negative D.C. voltage relative to the ground to said negative pulse power source 29. Reference numeral 42 designates a high resistance for discharging residual electric charge on the capacitors 38, 38a, 38b, ... The negative polarity output terminal $B_0$ of the negative pulse power source 29 is connected to the group of discharge electrodes 34 via a low resistance lead wire 43 and an insulator tube 44. Thereby the group of discharge electrodes 34 are applied with a voltage which consists of a negative D.C. voltage that is just lower than a sparking voltage (fed from the D.C. power source 35) superposed with a very steep periodic negative high pulse voltage having a small pulse width (fed from the pulse power source 29). In such a case, since the sparking voltage for such a pulse voltage is extremely high, the peak voltage of the applied voltage can be made extremely high and thus extremely high electric charge (proportional to the peak voltage) can be given to the floating particles in the gas introduced through the dust-containing gas inlet 31, so that it becomes possible to collect and remove these charged particles on the dust-collecting electrodes in a very effective manner. The function of the filter circuit 40 is to by-pass the pulse voltage generated by the pulse power source 29 so that the pulse voltage may not adversely affect upon the D.C. power source 35. Unless the filter circuit is provided, said pulse voltage would be superposed with the secondary voltage of the step-up transformer, resulting in a great voltage variation at the output of the filter circuit, and thus the operations of the overall power supply would become abnormal.

Figure 10:
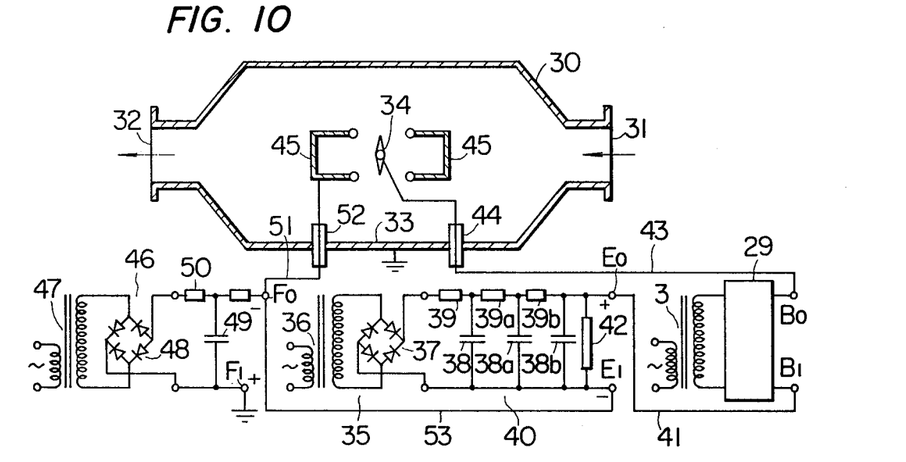

FIG. 10 shows another example of application of the pulse power source according to the present invention, in which the pulse power source 29 according to the present invention is utilized in an electric dust collecting apparatus provided with third electrodes which comprises a discharge electrode, dust collecting electrodes and third electrodes disposed in the vicinity of the discharge electrode, for applying a negative pulse high voltage supperposed with a positive D.C. high voltage for biasing, between said third electrode and said discharge electrode. In this figure, reference numeral 29 designates a negative high voltage pulse power source according to the present invention, numeral 35 designates a positive D.C. high voltage power source for applying a D.C. bias, and numeral 40 designates a filter circuit connected to said positive D.C. high voltage power source 35 for by-passing a pulse voltage. The names and functions of the other elements designated by numerals 3 through 39 in FIG. 10 are the same as those of the elements given with like numerals in FIG. 9. Reference numeral 45 designates third electrodes disposed in the vicinity of the discharge electrode 34 and insulatively supported from both the discharge electrode 34 and the dust collecting electrode 33, and in the illustrated embodiment the third electrodes 45 consist of channel-shaped electrodes disposed symmetrically on the opposite sides of the discharge electrode 34. Reference numeral 46 designates a negative D.C. high voltage power source for establishing a main electric field which comprises a step-up transformer 47, a rectifier 48, a smoothing capacitor 49 and a charging impedance 50, and among its output terminals $F_0$ and $F_1$, the positive polarity output terminal $F_1$ is grounded. The negative polarity output terminal $F_0$ is connected to the third electrodes 45 via a low resistance lead wire 51 and an insulating tube 52 to establish a main electric field for charging and dust-collecting between the third electrodes 45 and the grounded dust-collecting electrode 33, giving a negative polarity to the former electrodes. Still further, the negative polarity output terminal $F_0$ is connected to a negative polarity output terminal $E_1$ of the filter circuit 40 via a low resistance lead wire 53, while a positive polarity output terminal $E_0$ of the filter circuit 40 is connected to a positive output terminal $B_1$ of the negative high voltage pulse power source according to the present invention via a low resistance lead wire 41, and the negative output terminal $B_0$ of the pulse power source is connected to the discharge electrodes 34 via a low resistance lead wire 43 and an insulating tube 44. Thereby between the third electrodes 45 and the discharge electrode 34 is applied a positive D.C. bias high voltage directed from the former to the latter as superposed with a periodic negative steep pulse high voltage, and each time the voltage is applied, a negative ion current flows impulsively from the discharge electrode 34 to the dust collecting electrode 33. This negative ion current consists of a negative ion cloud having a very high density and a very good dispersive property caused by its intense Coulomb's repulsive force, and forms a uniform current distribution on the dust-collecting electrode, and its current density can be freely controlled while always maintaining said main electric field at the optimum condition by changing the peak value of the pulse voltage, its repetition frequency and the value of the D.C. bias voltage, so that inverse ionization in case that the electric resistance of the dust is very high as well as corona inhibit action in case that the contained dust density is extremely high can be completely overcome, and always the highest dust-collecting performance can be realized. The above-described bias power source 35 is provided for the purpose of maintaining the potential of the tip end of the discharge electrode 34 at a potential in the middle of the third electrodes 45 and the dust-collecting electrode 33 in the pause interval of the pulse voltage, thereby preventing a D.C. negative corona discharge from arising from the tip end of the discharge electrode 34 in the pause interval of the pulse voltage, and thus assuring that corona discharge may occur always in an impulsive manner.

Figure 11:
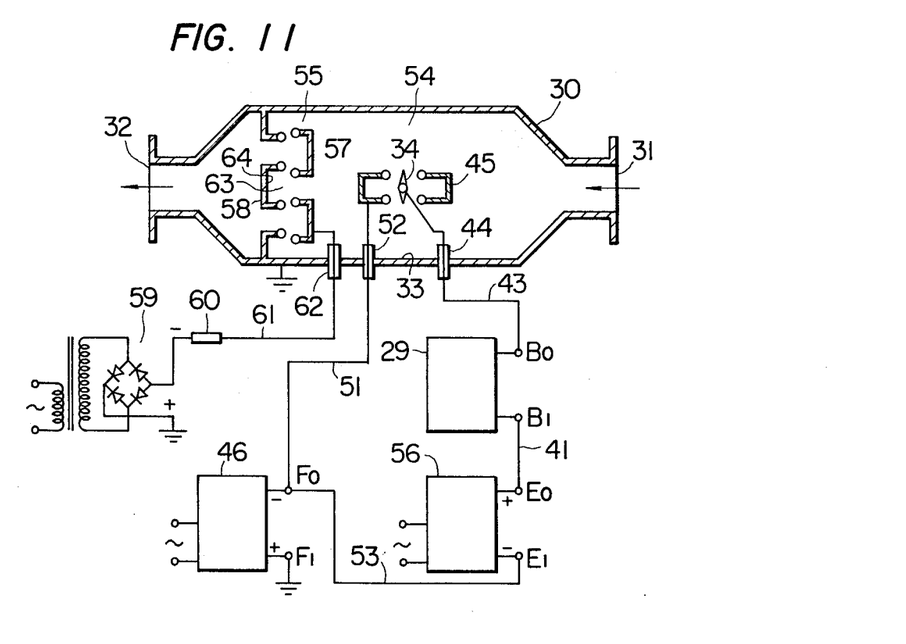

FIG. 11 shows still another example of application of the pulse power source according to the present invention, in which the electric dust collecting apparatus provided with third electrodes employing the pulse power source according to the present invention and shown in FIG. 10 is utilized as a charging section 54 in a two-stage type electric dust collecting apparatus, and floating particles in the gas introduced through a dust-containing gas inlet 31 are preliminarily charged by this charging section 54 and then collected in a particle collecting section 55 having a D.C. electric field, and in other words, FIG. 11 shows utilization of the pulse power source according to the present invention to an electric dust collecting apparatus according to a prior invention invented by one of the inventors of this invention (U.S. Pat. No. 3,980,455, issued Sept. 14, 1976). In this figure, reference numeral 56 designates a positive polarity bias power source consisting of the D.C. high voltage bias power source 35 and the filter circuit 40 connected thereto in combination as shown in FIG. 10. The particle collecting section 55 consists of a group of insulated upper stream channel-shaped electrodes 57 and a group of grounded down stream channel-shaped electrodes 58, and these electrode groups are disposed vertically along a cross-section perpendicular to the gas flow in a zig-zag form with their channel openings directed towards the down stream and the upper stream, respectively. In addition, to the upper stream channel-shaped electrode group 57 is applied a negative D.C. high voltage from a separate negative D.C. high voltage power source 59 through a protective resistance 60, a lead wire 61 and an insulating tube 62. Thereby in the space 63 between the electrode groups 57 and 58 are established a D.C. electric field and a contracted flow of gas, so that dust particles rushing into this space from the upper stream which have been preliminarily charged with negative charge in the particle charging section 54, can be effectively collected on the channel inner surfaces 64 of the down stream channel-shaped electrodes 58 under the actions of a hydraulic contractive force and an electric Coulomb's force. In this figure, the names and functions of the other elements designated by numerals 29 to 53 are exactly the same as those of the elements given with like reference numerals in FIG. 10. Cleaned gas is exhausted through an outlet 32.

Figure 12:
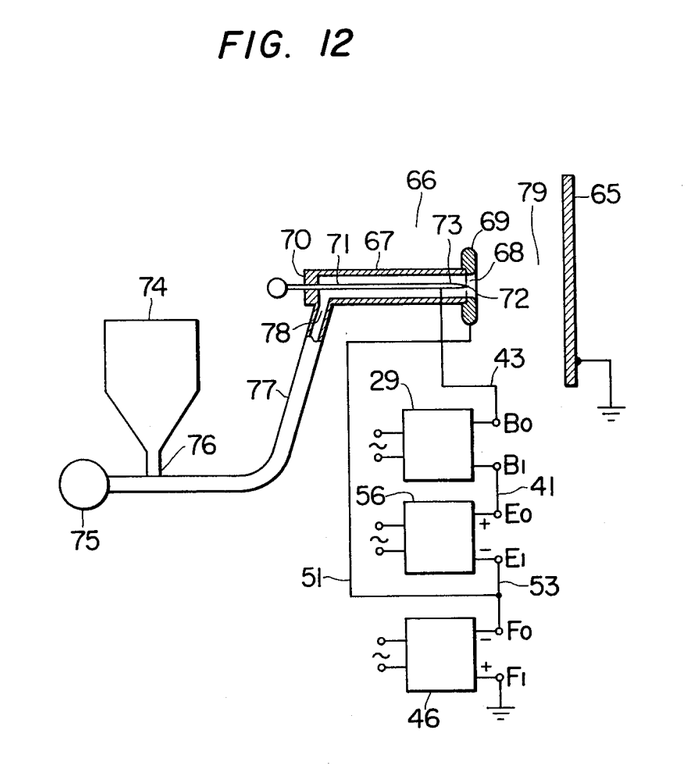
FIG. 12 shows application of the pulse power source according to the present invention to an electrostatic powder painting apparatus.

FIG. 12 shows yet another example of application of the pulse power source according to the present invention, in which the novel pulse power source according to the present invention is utilized to an electrostatic powder painting apparatus in which after electric charge has been given to powdered paint said paint is driven and adhered onto a body to be painted under the action of a Coulomb's force and in which the method for applying a pulse high voltage superposed on a D.C. high voltage is applied to the corona electrodes according to the previously referred prior invention invented by one of the inventors of the present invention (U.S. Pat. No. 4,011,991, issued Mar. 15, 1977) is employed. In this figure, reference numeral 65 designates a grounded body to be painted, and numeral 66 designates a powder gun disposed in front of the body spaced apart therefrom at a given distance, in which at an outlet end 68 of an insulator cylinder 67 is concentrically provided an annular drive electrode 69, an insulator rod 71 is slidably supported by a base portion 70 of the insulator cylinder 67 and is inserted in the insulator cylinder 67 along its center axis, and at the tip end of the insulator rod 71 is mounted a discharge electrode 73 having an acicular tip end so as to be positioned on the center axis of the cylinder 67. Reference numeral 74 designates a storage tank of powder paint, and the powder paint discharged from its bottom end 76 is conveyed by compressed air that is fed with pressure from a pump 75, and is fed into the powder gun 66 from an inlet port 78 at the bottom of the gun 66 through a pipe 77. Reference numeral 46 designates a negative D.C. high voltage power source for establishing a main electric field, whose positive polarity output terminal $F_1$ is grounded, and whose negative polarity output terminal $F_0$ is connected to the drive electrode 69 through a low resistance lead wire 51 to establish a main electric field for driving powder paint in the space 79 between this drive electrode 69 and the grounded body to be painted 65. The terminal $F_0$ is further connected to a negative polarity terminal $E_1$ of a positive polarity bias power source (including a filter circuit) 56 via a low resistance lead wire 53, a positive polarity terminal $E_0$ of the bias power source 56 is connected via a low resistance lead wire 41 to a positive polarity terminal $B_1$ of a pulse power source 29 for generating a steep negative pulse high voltage according to the present invention, and a negative polarity output terminal $B_0$ of the pulse power source 29 is connected to the above-referred corona discharge electrode 73 via a low resistance lead wire 43. Thereby between the drive electrode 69 and the corona discharge electrode 73 is applied a steep negative pulse high voltage as superposed with a positive bias D.C. voltage directed from the former towards the latter (for preventing D.C. corona during a pulse voltage pause period), and each time the negative pulse high voltage is applied, impulsive corona discharge is effected to feed a dense negative ion cloud having a good dispersive property towards the body to be painted 65. The powder paint fed to the interior of the powder gun 66 through a pipe 77 jointly with an air flow, is ejected through the outlet 68 into the space 79, where the powder paint collides with the negative ion cloud and is intensely charged, so that the powder paint can be driven by Coulomb's forces towards the surface of the body to be painted 65 and is adhered onto the surface. In this case, owing to the employment of the above-described pulse charging system, the current distribution over to surface to be painted becomes very uniform, and further, since the current density can be freely varied depending upon the electric resistance of the powder paint by adjusting the pulse repetition frequency, pulse peak value and bias voltage, generation of inverse ionization can be prevented, whereby very well finished painting can be achieved with an extremely high painting efficiency. In the preferred embodiments of the invention it was found that the sizes of $C_0$ ranged from 0.05 to 5 MFD with the value of $C_1$ selected to be about 10 times this size. Inductance L had a value of from 0.05 to 0.5 $\mu$Hy while the protective inductance 1 had a value of about 10 $\mu$Hy. The resonant frequency was approximately 1 MHz with pulse width $\tau$ equal to about 10 -1000 $\mu$s. Pulse $T_0$ is from 1 to 20 milli seconds in duration.

Since many changes could be made in the above construction and many apparently widely different embodiments of this invention could be made without departing from the scope thereof it is intended that all matter contained in the above description or shown in the accompanying drawings shall be interpreted as illustrative and not in a limiting sense.

What is claimed is:

1. A pulse power source for applying a pulse voltage to a capacitive load, comprising a D.C. power source, a power source capacitor having a sufficiently large electrostatic capacity with respect to an electrostatic capacity of said capacitive load and connected across said D.C. power source via a current limiting impedance, a parallel connection of a load charging switch element and a load charge recovering switch element which can be individually opened or closed, said parallel connection of switch elements and an inductance for generating transient oscillation being serially connected between one end of said power source capacitor and one end of said capacitive load, the other end of said power source capacitor being connected to the other end of said capacitive load, a parallel connection of a rectifier element for preventing inverse charging of said capacitive load and a switch element for discharging residual charge on said capacitive load, which are connected in parallel to said capacitive load, and control means for successively making said load charging switch element, charge recovering switch element and residual charge discharging switch element conduct in the above-described sequence for a period substantially equal to a pulse width of said pulse voltage, a period substantially equal to one-half period of said transient oscillation and a pulse pause interval, respectively.

2. A pulse power source as claimed in claim 1, in which silicon controlled rectifiers are employed for said load charging switch element, charge recovering switch element and residual charge discharging switch element.

3. A pulse power source as claimed in claim 1, in which said load charging switch element is also used as a charge recovering switch element.

4. A pulse power source as claimed in claim 1, in which a rectifier element is employed for said charge recovering switch element.

5. A pulse power source as claimed in claim 1, in which there is provided a transformer for recovering residual charge on said capacitive load, a primary winding of said transformer being connected in series to said residual charge discharging switch element, and a secondary winding of said transformer having a sufficiently high step-up ratio with respect to said primary winding being connected across said power source capacitor via a rectifier.

6. A pulse power source as claimed in claim 1, in which said parallel connection of the load charging switch element and the load charge recovering switch element is effectively realized by means of four rectifier elements connected in a full-wave rectifier bridge form and a switch element connected across a load side diagonal of said rectifier bridge, a source side diagonal of said rectifier bridge being connected between said one end of said power source capacitor and one end of said inductance for generating transient oscillation, whereby said switch element serves both as said load charging switch element and as said load charge recovering switch element.

7. A pulse power source as claimed in claim 1, in which a series connection of a rectifier element and an inductance element is used for said charge recovering switch element.

8. A pulse power source as claimed in claim 1, which is adapted to be connected between discharge electrodes and dust collecting electrodes in an electric dust collecting apparatus comprising discharge electrodes and dust collecting electrodes.

9. A pulse power source as claimed in claim 1, which is connected between third electrodes and discharge electrodes in an electric dust collecting apparatus comprising discharge electrodes, dust collecting electrodes and third electrodes disposed in the visinity of the discharge electrodes.

10. A pulse power source as claimed in claim 1, which is connected to a charging section consisting of discharge electrodes, dust collecting electrodes and third electrodes in a two-stage type electric dust collecting apparatus.

11. A pulse power source as claimed in claim 1, which is connected between a discharge electrode and a drive electrode of a powder gun in an electrostatic powder painting apparatus which gun consists of the discharge electrode and the drive electrode.

12. A pulse power source characterized in that a power source capacitor having a sufficiently large electrostatic capacity with respect to an electrostatic capacity of a capacitive load is connected to a D.C. power source via a current limiting impedance, between one end of said power source capacitor and one end of said capacitive load are serially connected a parallel connection of a load charging switch element and a load charge recovering switch element which can be individually opened and closed and an inductance for generating transient oscillation, the other end of said power source capacitor being connected to the other end of said capacitive load, a parallel connection of a rectifier element for preventing inverse charging of said capacitive load and a switch element for discharging residual charge on said capacitive load is connected in parallel to said capacitive load, and there is provided a control section for successively making said load charging switch element, charge recovering switch element and residual charge discharging switch element conduct in the above-described sequence for a period substantially equal to a pulse width, a period substantially equal to one-half period of said transient oscillation and a pulse pause interval, respectively.

* * * * *

UNITED STATES PATENT AND TRADEMARK OFFICE
CERTIFICATE OF CORRECTION

PATENT NO. : 4,107,757
DATED : August 15, 1978
INVENTOR(S) : Senichi Masuda, et al It is certified that error appears in the above-identified patent and that said Letters Patent are hereby corrected as shown below:

Column 1; line 63:
"successiveling" should be --successively--

Column 2; line 20:
"shows" should be --show--

Column 4; line 16:
"attennation" should be --attenuation--

Column 5; lines 51 and 52:
"supperposed" should be --superposed--

Column 6; line 64:
"viz" should be --via--

Column 7; lines 6 and 7:
"repetetion" should be --repetition--

Column 7; line 28:
"it is" should be --is it--

Column 9; line 26:
"fulfil" should be --fulfill--

Column 11; line 4:
"22a⟶•" should be --22a⟶--

Column 11; line 47:
"i" should be --current i--

UNITED STATES PATENT AND TRADEMARK OFFICE
CERTIFICATE OF CORRECTION

PATENT NO. : 4,107,757

DATED : August 15, 1978

INVENTOR(S) : Senichi Masuda, et al

It is certified that error appears in the above—identified patent and that said Letters Patent are hereby corrected as shown below:

Column 14; line 40:
   "supperposed" should be --superposed--

Column 17; line 34:
   "milli seconds" should be --milliseconds--

Column 18; line 49:
   "visinity" should be --vicinity--

Signed and Sealed this

Eighth Day of May 1979

[SEAL]

Attest:

RUTH C. MASON
Attesting Officer

DONALD W. BANNER
Commissioner of Patents and Trademarks